United States Patent
Luy et al.

(10) Patent No.: US 7,248,839 B2
(45) Date of Patent: Jul. 24, 2007

(54) ARRANGEMENT FOR OPERATING VARIOUS TERMINAL DEVICES

(75) Inventors: Johann-Friedrich Luy, Ulm (DE); Thomas Müller, Ulm (DE); Stephan Mayer, Bühlenhausen (DE); Günter Reichert, Affalterbach (DE)

(73) Assignee: DaimlerChrysler AG, Stuttgart (DE)

( * ) Notice: Subject to any disclaimer, the term of this patent is extended or adjusted under 35 U.S.C. 154(b) by 313 days.

(21) Appl. No.: 10/297,565

(22) PCT Filed: Jun. 6, 2001

(86) PCT No.: PCT/EP01/06400

§ 371 (c)(1),
(2), (4) Date: Jul. 28, 2003

(87) PCT Pub. No.: WO01/95507

PCT Pub. Date: Dec. 13, 2001

(65) Prior Publication Data

US 2004/0038661 A1    Feb. 26, 2004

(30) Foreign Application Priority Data

Jun. 9, 2000 (DE) .................. 100 28 189
Jun. 6, 2001 (DE) ............... 201 09 370 U (51) Int. Cl.
*H04B 1/46* (2006.01)
(52) U.S. Cl. ............... 455/82; 455/78; 455/575.7; 455/575.9; 455/129; 455/269; 343/702; 343/700 MS; 375/219; 333/193
(58) Field of Classification Search ........... 455/82, 455/78, 575.7, 575.9, 129, 269; 343/702, 343/866; 333/193; 375/219
See application file for complete search history.

(56) References Cited

U.S. PATENT DOCUMENTS

| | | | | |
|---|---|---|---|---|
| 4,850,034 A | * | 7/1989 | Campbell | 455/74 |
| 5,379,455 A | * | 1/1995 | Koschek | 455/273 |
| 5,398,036 A | * | 3/1995 | Nakase et al. | 343/860 |
| 5,722,058 A | * | 2/1998 | Umemoto et al. | 455/140 |
| 6,115,592 A | * | 9/2000 | Ueda et al. | 455/307 |
| 6,282,433 B1 | * | 8/2001 | Holshouser | 455/556.2 |
| 6,377,685 B1 | * | 4/2002 | Krishnan | 379/433.07 |
| 6,380,823 B1 | * | 4/2002 | Ikata et al. | 333/133 |
| 6,396,365 B1 | * | 5/2002 | Miller et al. | 333/129 |

FOREIGN PATENT DOCUMENTS

GB        2281663         *    8/1995

* cited by examiner

*Primary Examiner*—Marceau Milord
(74) *Attorney, Agent, or Firm*—Akerman Senterfitt; Stephan A. Pendorf; Yonghong Chen (57) ABSTRACT

In a first embodiment, the invention relates to an arrangement for operating a plurality of terminal devices (6) on a common antenna (4) with a coupling network (2) comprising a first separator (8) associated with the antenna (4) and a second separator (10) associated with the respective terminal (6). In a second embodiment, the invention relates to an arrangement for operating a plurality of terminal devices (6) on a common transmitting antenna (4") and on a common receiving antenna (4) which is separate from the common transmitting antenna (4") with a coupling network (2) comprising a separator (10) which is associated with the respective terminal.

31 Claims, 5 Drawing Sheets

ARRANGEMENT FOR OPERATING VARIOUS TERMINAL DEVICES

BACKGROUND OF THE INVENTION

1. Field of the Invention

The invention is concerned with an arrangement for the operation of multiple radio controlled terminal devices using a common antenna.

2. Description of the Related Art

In general, the number of terminal devices for mobile communications is increasing in vehicles such as, for example, busses, automobiles, etc. Therein, besides employment for audio transmissions, these terminal devices (also referred to as mobile telephone devices) are employed ever frequently for the transmission of data in telephonic or emergency assistance systems.

Both for optical reasons as well as for space and cost considerations the number of antennae on the vehicle required for this increasing number of terminal devices cannot be increased without limit.

From DE-A-195 47 288 A1 the radio station with a setoff or separate antenna unit is known, wherein a duplexer is provided close to the antenna. Beyond this, a pre-amplifier is likewise provided close to the antenna. This antenna unit is in the form of a unit integrated with the transmitter and receiver antenna and is in communication via two dedicated separated transmission and receiving branches with unidirectional transmitter or receiver units.

From U.S. Pat. No. 4,228,544 a transmitter and receiver unit for vehicles is known with a common transmitter and receiver antenna, wherein the base of the transmitter and receiver antenna is connected with an aerial combining unit in the immediate vicinity of the transmitter and receiver antenna. A preamplifier connected with the aerial combining unit is likewise provided in the immediate vicinity of the antenna base.

SUMMARY OF THE INVENTION

The first main task of the invention is thus, to provide an arrangement for operation of multiple terminal devices with a common antenna, which is characterized by a construction or design which is particularly simple and a communication which is as free as possible of feedback, with a simultaneous minimization of the complexity of cabling. Since by the use of one common antenna, of which the setup location is besides this located setoff (that is, at a greater distance or separation) from the respective terminal devices, the minimization of the necessary cabling expense represents, with the common guidance of the terminal devices due to the one single antenna, a significant element within the framework of the problem being addressed by the invention.

This first main task of the invention is solved in accordance with a first embodiment of the invention by an arrangement or system for the operation of multiple terminal devices via a common remote antenna with a coupling network, which includes a first separator associated with the antenna and a second separator associated with the respective terminal device. Herein the first and the second separator are particularly preferably functionally as well as spatially a single unit. In this manner particularly advantageously this coupling network can be compactly constructed and depending upon the predetermined environmental geometry can be positioned at the best and most suitable position for installation of the inventive device. Particularly advantageous is the fact, that the coupling network functionally is not associated with either the antenna nor one of the terminal devices, from the perspective that the three essentially separate components of the inventive device, that is the antenna, the coupling network and the terminal devices, can be optimally positioned completely independently of each other.

With the inventive arrangement there is provided in particularly advantageous manner the possibility to connect with each other bi-directional operating terminal devices, that is, terminal devices which are capable of transmitting information as well as receiving it. For this, in one separator (10) the bi-directional transmission lines coming from the terminal devices must be separated into transmitting and receiving branches, in order subsequently to bring back together all the terminal device associated transmitting and receiving branches respectively preferably using a summing element. After the recombination, the two separated transmitting and receiving branches can be directly reconnected again via the separator (8). Therewith there results again a bi-directional transmission line to the antenna, on or along which now again all signals of the individual terminal devices can be communicated in common. In this manner the inventive design of the coupling element is realized in advantageously a compact design of the inventive device, which in its functionality and application is distinctly separate from that which comprises the state of the art. Thus, in contrast, for example the device known from DE 195 47 288 in particular intends that both separators are not integrated in a compact, variably locatable unit, but rather are intentionally provided spaced as far apart from each other as possible, so that the separated transmitter and receiver branches can be routed independently from each other as long as possible. Such an arrangement would be, in particular when applied to automotive vehicles, disadvantageous for economical reasons, since it results in additional cabling requirements.

According a first inventive embodiment of the first embodiment the coupling network is located between the antenna and the mobile telephone devices, for example in the trunk of a vehicle beside the mobile telephone devices.

According to a second inventive variant of the first embodiment the coupling network is a component of a mobile telephone device, which includes at least one additional output/input for one or more mobile telephone devices. Further, it is of course also conceivable, depending upon as appropriate to the coupling network, to integrate this as an independent unit at or in the antenna or however to introduce this as a unit in another device (for example in the control device for other vehicle components). By an advantageous integration into a device already present on board the vehicle there is advantageously possible therewith to employ already existing electrical components, such as for example network devices, for use by components of the coupling network.

The coupling network of the first embodiment includes supplemental amplifiers, dividers and/or summing elements as an advantageous aspect of the invention.

The invention, in accordance with the first embodiment, is based upon the idea, that multiple terminal devices are to be operated within an enclosed space for mobile communication via a single antenna. So that a feedback effect of the one terminal device upon adjacent neighboring terminal devices can be avoided, preferably first separators are provided for separation of transmitted and received energy at the antenna. By this first separator it is ensured that, on the one hand, transmitting and receiving waves are separated at the antenna side. On the other hand, by a second separator, the transmitted and received waves of the respective terminal device are separated from each other, whereby the combination or the separation of the transmission or as the case may be received waves of various terminal devices occurs separate from each other. Thereby a return effect of a transmitting terminal device on an adjacent terminal device can be particularly reliably avoided. Beyond this, the complexity for the installation of supplemental antennas for multiple terminal devices, in particular mobile telephone terminal devices, is substantially reduced.

Preferably, as the separator, a wave-guide circulator or a directional coupler is provided. In the wave-guide circulator this may be a cyclic designed n-gate, preferably a 3-gate, wherein the signals of one of the gates respectively only goes to the mixed gate in the sense of a circulation. Therewith there occurs with the aid of the circulator a separation of transmitter and received signal. Wave-guide circulators or as the case may be directional couplers are employed as separators particularly in time duplex operation (also referred to as time divisional duplex standard, TDD in short) or however also in frequency duplex operation (also referred to as frequency divisional duplex standard, FDD for short).

For the separation of transmitting and received signals during communication in a frequency duplex operation (also referred to as frequency divisional duplex standard, FDD for short), for example in the case of GSM network (GSM=Global System for Mobile Communication), there is preferably employed as separator a filter, in particular a duplex filter. The duplex filter serves thereby for separation of the forward and reverse direction, that is the transmitter and receive direction. The duplex filter includes a bi-directional connection and two unidirectional connections, which are respectively associated with the corresponding frequency band.

For separating or distributing the frequency bands received by the common antenna to the terminal devices it is advantageous to employ a divider. For emitting the transmission signal of the terminal devices over the common antenna a summing element is provided on the transmitter side. For compensation of the losses of the transmitted or received signals one amplifier element is preferably provided in the transmitter and in the receiver branches, respectively. Therein the amplifier element is preferably provided between the first and the second separator. Preferably, the antenna is provided on the receiving side with its own amplifier element. Depending upon the type and design of the device as well as depending upon the type of communication, one common amplifier element is preferably provided, preferably on the transmitter side of all terminal devices. Alternatively or additionally the transmitter side and/or receiver side of the individual terminal devices can be provided with their own amplifier element.

A second main task of the invention is comprised in providing a device for operating multiple terminal devices with a common transmission antenna and a common receiver antenna separated from the common transmitter antenna, which has a particularly simple construction and as free as possible of feedback communication. In the framework of this second task a particular task of the invention is comprised in the minimization of the cabling requirement, in particular in the case when numerous terminal devices are operated.

This second task is solved in accordance with a second embodiment of the invention by an arrangement or system for operation of multiple terminal devices on a single transmitting antenna and one receiver antenna with a coupling network, which includes a second separator associated with the respective terminal device.

In accordance with a first inventive solution of the second embodiment the coupling network is located between the antenna and a mobile telephone device, for example in the trunk of a vehicle beside the mobile telephone device.

According to a second inventive solution of the second embodiment the coupling network is a component of the mobile telephone device, which includes at least one additional output/input for one or more mobile telephones.

According to a third solution of the second embodiment the coupling network is provided in the vicinity of the transmitting antenna and/or the receiving antenna, or spatially integrated in one or as the case may be both antennas. A further advantageous arrangement results from the integration of the coupling network in a device already existing in the vehicle, preferably utilizing already existing components, such as for example a network device.

The coupling network of the second embodiment likewise includes additional amplifiers, dividers and/or summing elements or integrators.

The invention according to the second embodiment is based upon the idea that, in a closed space, multiple terminal devices are to be operated for mobile communication via respectively separate transmitter and receiver antennas. So that a feedback of the one terminal device upon the adjacent terminal device is avoided, preferably separators for separation of transmitted and received energy are provided at the terminal device.

Via the separators the transmission and received waves of the respective terminal devices are separated from each other, wherein the combination or the separation of the transmission or as the case may be received signals of various terminal devices occurs separately from each other. Thereby a feedback of a transmitting terminal device on an adjacent terminal device can be avoided particularly simply. Beyond this, the cost and complexity of the installation of supplemental antennas for multiple terminal devices, in particular mobile telephone telephone terminal devices, is substantially reduced.

Preferably, as in the first embodiment, a wave-guide circulator or a rectifier coupler is provided as separator. In the wave-guide circular this may be a cyclic designed n-gate, preferably a 3-gate, of which the signal of one gate is respectively conveyed to the next gate in the circulation sense. Therewith there occurs with the aid of the wave-guide circulator a separation of transmission and received signal. Wave-guide circulators or as the case may be rectifying couplers are in particular employed in time duplex operation (also referred to as time division duplex standard, TDD for short) or however also in frequency duplex operation (also referred to as frequency division duplex, FDD for short) as separator.

For separation of transmit and receive signals in communication in frequency duplex operation (also referred to as frequency division standard, FDD for short), for example in GSM-network (GSM=Global System for Mobile Communication), a filter is preferably provided as separator, in particular a duplex filter, preferably on the terminal device side. The duplex filter serves thereby for separation of the forward and backward direction, that is, the transmit and receive direction. The duplex filter includes a bi-directional connection and two unidirectional connections, which are respectively associated with the appropriate frequency band.

For emission of the transmission signals of the terminal devices over the common antenna, a summation unit is provided on the transmission side. For compensation of the losses of the transmission or received signals it is useful to provide at least one amplifier element. Preferably the antennas are provided on the receive side and/or transmission side with one single amplifier element. Depending upon type and design of the system as well as depending upon the communication one amplifier element is preferably provided on a transmitter side and/or receiver side of all terminal devices respectively.

BRIEF DESCRIPTION OF THE DRAWINGS

Illustrated embodiments of the invention are explained on the basis of a drawings. Therein there is shown.

DETAILED DESCRIPTION OF THE INVENTION

Corresponding parts are referred to in all figures with the same reference numbers.

Figure 1:
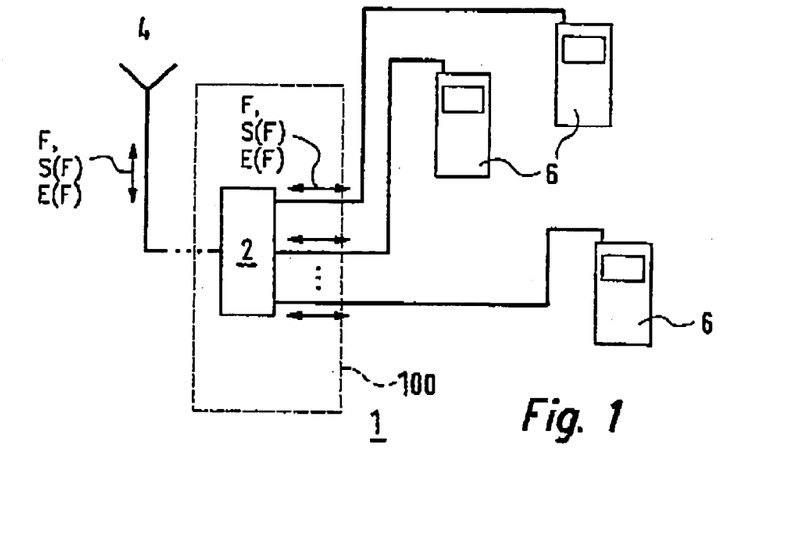
FIG. 1 a schematic of an arrangement for operation of multiple terminal devices on a common antenna with a coupling network according to a first embodiment of the invention, FIG. 2 a schematic of a coupling network according to FIG. 1, FIG. 3 a schematic of an alternative embodiment of the first embodiment of the coupling network according to FIG. 1, FIG. 4 a diagram with transmission function of a duplex filter for the GSM-network according to the first embodiment of the invention, FIG. 5 a diagram with a block decision flow for the GSM-network, FIG. 6 a schematic of an arrangement for operation of multiple terminal devices on a common transmission antenna and a common receiver antenna with a coupling network according the second embodiment of the invention, FIG. 7 a schematic of a coupling network according to FIG. 6, FIG. 8 a schematic of an alternative variant of the second embodiment of the coupling network according to FIG. 6, FIG. 9 a schematic a further alternative variant of the second embodiment of the coupling network according to FIG. 6.

In FIG. 1 a device 1 is shown with a coupling (interstage) network 2 for division or separation of signals E received by the antenna 4 with the frequency F to the terminal devices 6, for example mobile telephone terminal devices. Alternatively or additionally the coupling network 2 serves for bundling of transmitted signals S of the terminal devices 6. The coupling network 2 is, in accordance with a first variant of the first embodiment, as indicated by dashed lines 100 in FIG. 1, arranged as a compact unit between the antenna and the terminal devices.

According to a second inventive variant of the first embodiment the coupling network 2 is integrated as a component of a terminal device, which includes at least one supplemental output or input for connection of further mobile telephone devices.

A third possibility of the incorporation of the coupling network is comprised therein, that it is integrated directly or in proximity to the antenna, or however that the supplemental unit is integrated in a device which is independent from the transmission and receive mimic (for example a motor-control device).

Figure 2:
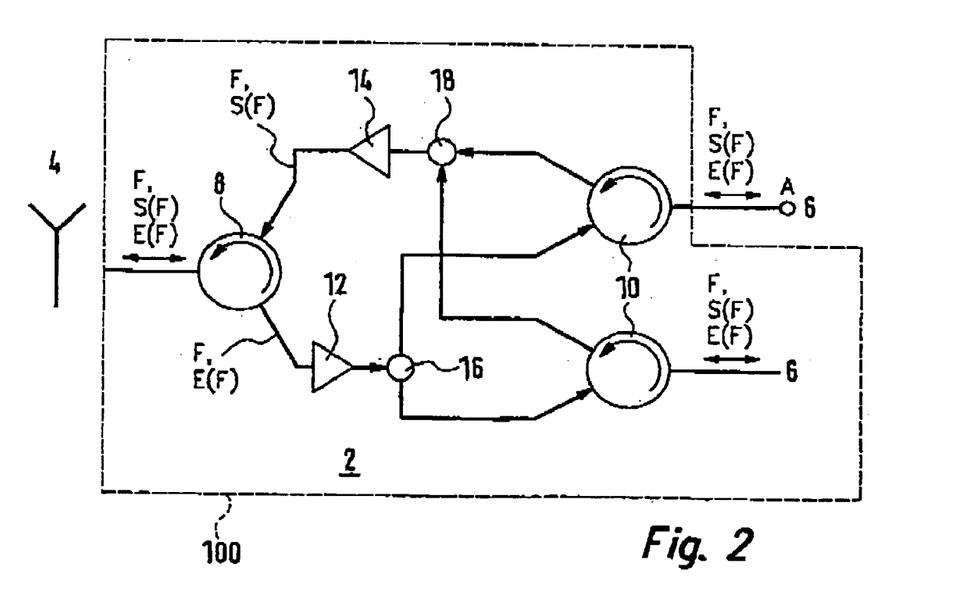

In FIG. 2 an embodiment of the coupling network 2 according to FIG. 1 is schematically represented, which is in particular suited for a time duplex network TDD or frequency duplex network FDD. The coupling network 2 includes a first separator 8 associated with the antenna 4 as well as a number of second separators 10, corresponding to the number of the terminal devices 6, which are associated with the terminal devices 6. As first and second separator 8 or as the case may be 10 there are preferably provided wave-guide circulators, which have a particularly simple construction and are designed to be free of feedback. Alternatively, rectifying couplers can be employed.

The complete coupling network 2 of FIG. 2 can advantageously, as indicated by the dashed lines 100, be integrated in a mobile terminal device 6 (base terminal device). Therein at least one input/output A of the base terminal device is provided for the connection of further mobile terminal devices. Of course the number of the inputs and outputs can be varied.

For compensation of losses a first amplifier element 12 is provided on the receiving side of the antenna 4. On the transmitting side the terminal devices 6 are provided with a common second amplifier element 14 for compensation of losses. For separating or dividing the signals E received by the antenna 4 with the frequency F by the terminal devices 6, a divider 16 is provided downstream of the first separator 8. For bundling and transmitting the transmitting signal S with a frequency F of the terminal device 6 over the common antenna 4 a summing element 18 is provided on the transmitter side between the first and the second separator 8 or as the case may be 10.

In the "receiving" operation of the device 1 a received signal E(F) is separated subsequent to the common antenna 4 by the first separator 8 from the transmit signal S(F) and separated by means of the divider 16 to the second separator 10, for example circulator. The second separator 10 conveys the received signal E(F) simultaneously to the concerned or appropriate terminal device 6, for example a mobile telephone telephone terminal device. The loss during receiving the signal E(F) is compensated by the amplifier element 12.

During transmission via one or more of the terminal devices 6 the substantial part of the load of the associated second separator 10 is conveyed via the summing element 18 to the first separator 8 and from this is directed to the common antenna 4. The wattage loss or signal loss during transmission is compensated by the amplifier element 14. Of course it could in certain cases be advantageous to also possibly amplify beyond this signal loss, in order to increase overall the wattage emitted via the antenna 4. Beyond this, the amplifier elements 12 and 14 serve for improving the decoupling of the terminal devices 6 from each other.

Depending upon the design of the coupling network the amplifier elements 14 or as the case may be 12 could alternatively or additionally also lie between the second separator 120 and the summer 18 or as the case may be the separator 16, whereupon then for each terminal device branch one transmitter (14) and/or receiver amplifier element (12) is necessary.

Figures 3, 4:
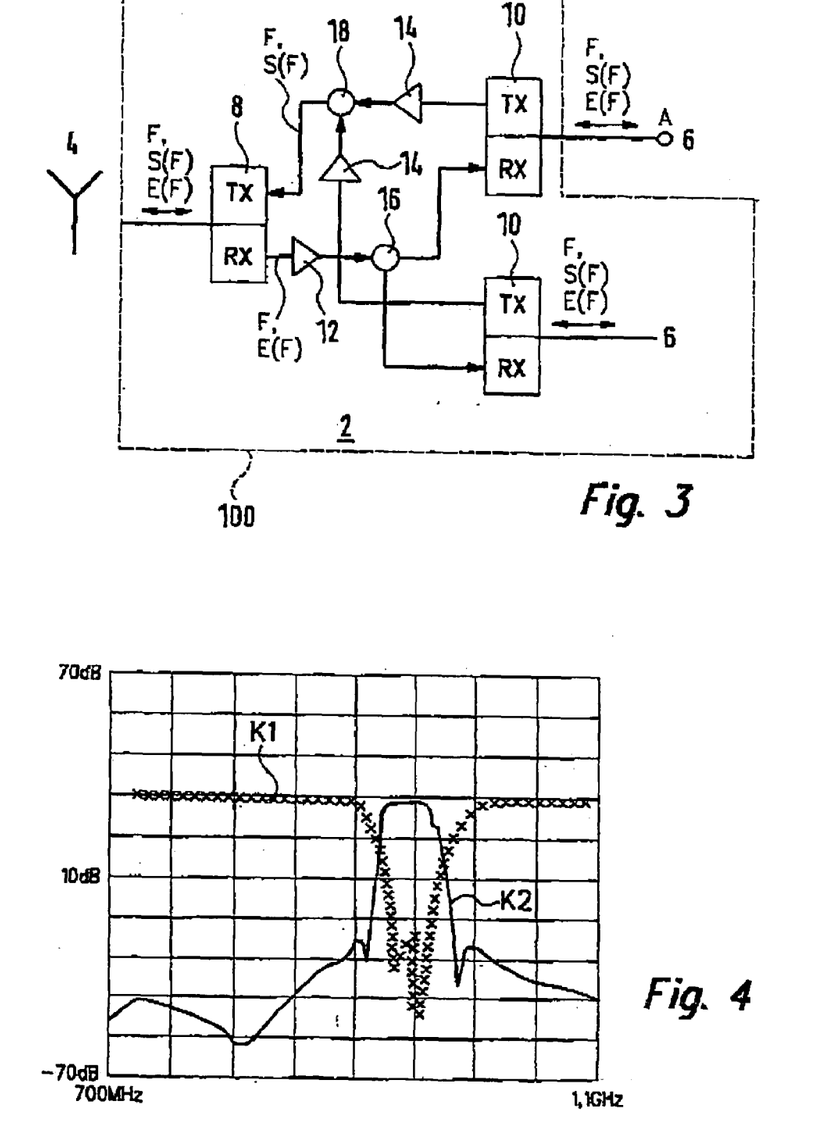

In communication by a frequency duplex operation, for example GSM, the coupling network 2 also includes filters, in particular duplex filters, as schematically represented in FIG. 3, preferably in place of circulators as separators 8 or as the case may 10. Duplex filters are produced in large quantities for GSM-terminal devices 6 and are thus particularly economical construction elements, which separate the transmission and receive channels from each other. Alternatively, other electronic components with the same functionality can be employed as separators 8 or as the case may be 10. Alternatively in the frequency duplex operation in place of the filter also frequency circulators or rectifying couplers can be employed.

During receiving the received signal E(F) is amplified by the amplifier element 12 and divided by means of the divider 16 to the two separators 10 as duplex filter and therewith to the terminal device 6. In the case of transmission, following the separators 10 a separate amplification for each terminal device 6 occurs by means of the amplifier elements 14, in order to insure a better decoupling of the terminal devices 6 and to compensate for the losses in the filters of the separators 10. This means, each terminal device 6 includes on the transmitter side in the appropriate channel an associated amplifier element 14. Therewith in the case of GSM communication on the transmission side a number of amplifier elements 14 corresponding to the number of the terminal devices 6 is provided.

Depending upon the design of the network, the amplifier elements 12 or as the case may be 14 can, as before, be provided alternatively or additionally also between the first separator 8 and the summing element 18 or as the case may be between the second separator 10 and the divider 16, wherein in the terminal device branches respectively one transmitter 14 and/or receiver amplifier 12 is necessary.

Alternatively to the design as separate device between antenna 4 and the terminal devices 6, the complete coupling network 2 can, as indicated in FIG. 3 by the dashed lines 100, in advantageous manner be integrated in the mobile terminal device 6 (base terminal device). Therein the in/output A of the base terminal device is available for further mobile terminal devices. Of course, as in the embodiment according to FIG. 2 the number of the in and outputs can be varied.

As already shown in FIG. 2, the coupling network also can according to FIG. 3 be incorporated in or beside the antenna or in any of the other devices.

Via the first separator 8 (=transmission filter) the bundled transmission signal S from the transmission signals S of the terminal devices 6 is provided to the antenna 4 via the summing element 18 and transmitted. FIG. 4 shows an example of the transmission functions of a duplex filter of the company Murata for GSM. A suppression of approximately 40 dB for a respective different channel is achieved (channel K1 as compared to channel K2).

Figure 5:
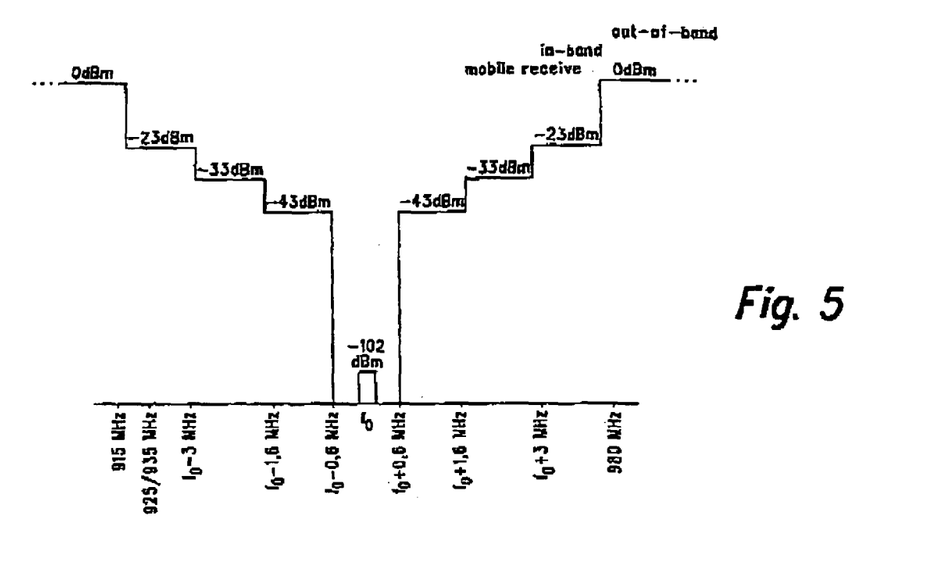

The requirements of the duplex or coupling filter are derived from the GSM specifications, for example in FIG. 5 the blocking requirements are graphically represented. From the transmission wattage or power of GSM one can calculate there from a necessary channel suppression of 36 dB.

The advantages achieved with the invention in accordance with the first embodiments of FIGS. 1–5 is comprised particularly therein, that by means of the coupling network 2 the device 1 is suitable for operation of multiple terminal devices 6 on a single common antenna 4. Beyond this, by the positioning of the coupling network 2 in the proximity of terminal device, the investment in cabling is minimized, since the multiplication of the cabling in correspondence to the number of the terminal devices exists only for the relatively short distance between coupling network and terminal device. By the use of circulators or as the case may be filters as separators 8 and 10 the incoming and outgoing waves are separated from each other, so that a feedback-free communication of multiple terminal devices 6 is made possible particularly simply and reliably. In particular the bundling or the separation of the transmission signal S or as the case may be the receive signal E of the one or more of the various terminal devices 6 can be carried out separately from each other, that is, for the waves being received and transmitted via the single common antenna 4 there occurs a separate summation or as the case may be division. Beyond this, as necessary, in advantageous manner the transmission and receive signals S or as the case may be E can be amplified separately from each other for in and outgoing waves, whereby a particularly good decoupling results. By a suitable dimensioning of the components of this arrangement, this is employable for all presently existing and future planned mobile telephone standards. Beyond this, the device can be tailored for the operation of one or simultaneously multiple terrestrial or satellite supported mobile telephone standards (GMS 900, GSM 1800, AmPS, PDC, CDMA, UMTS, ICO, Globalstar, . . . ). For this, in advantageous manner above all the amplifiers, the separators and the summers/dividers must be set to the respectively desired frequency range.

A second embodiment of the invention will now be described with reference to FIGS. 6–9.

In FIG. 6 there is again shown a device 1 with a coupling network 2 for distribution of signals E with the frequency F received via a separate receiving antenna 4' to the terminal devices 6. Alternatively or additionally the coupling network 2 serves for bundling of transmitted signals S or terminal devices 6. In the second embodiment the coupling network 2 serves to couple-in the signals S produced by the terminal devices 6 for transmission into a separate transmission antenna 4". As in the first embodiment, the coupling network could be a separate device between the antenna and the mobile telephone devices. Alternatively thereto the coupling network could be in the form of a component of a mobile telephone device, wherein this exhibits at least one supplemental out/input for one or more mobile telephone devices. According to the second illustrative embodiment the coupling network 2 can be provided in the vicinity of or as a functional independent element in the transmission antenna 4" and/or the receiving antenna 4', or however also as a component of an independent device.

Figure 6:
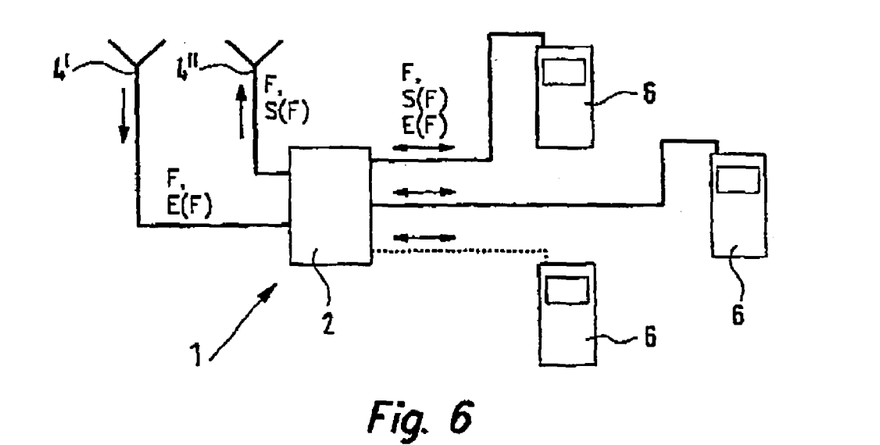

According to the second embodiment of FIG. 6 it is possible to employ radio services, which transmit and receive in time multiplex or in frequency multiplex (for example UMTS-TDD). The necessary damping between the transmission and receiving path occurs by the free space damping between the two antennas 4' and 4" which are preferably positioned with sufficient distance from each other. It is in advantageous manner also conceivable to separate the two antennas from each other by insulating means. Thus it would be conceivable, in this case, to decouple parts of the signal from the transmission branch and, depending upon the position of the antennas relative to each other, to couple these into the receiving branch in time-delay. By suitable time displacement (phase shift by 180°) there results thereby a quenching of the signal radiated directly from the transmission antenna into the receiving antenna.

Figure 7:
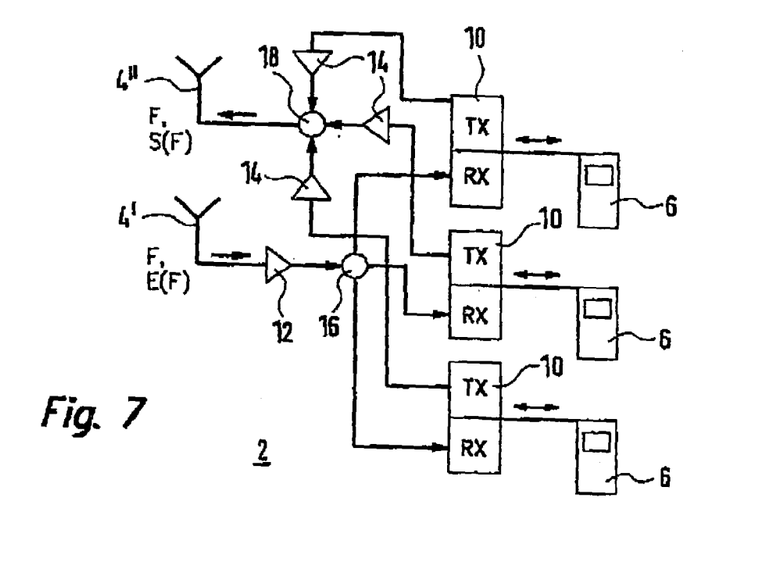
Figure 8:
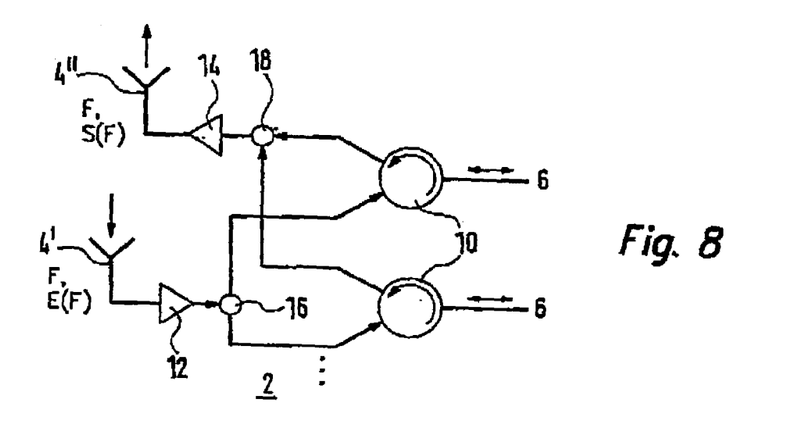

The separation of transmitted and received power occurs in the most general cases with the aid of separators, for example circulators, is shown in FIG. 8. For FDD standards (frequency duplex standards) the circulators can be replaced by transmit/receive duplex filters (as shown in FIG. 7). For TDD and FDD services (time and frequency duplex services) the separation can also occur via switches according to the arrangement shown in FIG. 9.

For GSM the requirements with respect to wattage or power directivity for an interference free operation of the mobile telephones can be found in the following standards known to technical people in this art: ETS 300 577 (GSM Radio transmission and reception) and from ETS 300 574 (multiplexing and multiple access on the radio path).

In FIG. 7 an example of a coupling network 2 is illustrated, of which the transmission and receiving paths on the side of the terminal devices is carried out with the aid of transmission/receive duplex filters 10. If one of the terminal devices 6 transmits, then the wattage is conveyed through the duplex filter 10 to the amplifier element 14, summed in the summing element 18 and then reaches the transmission antenna 4". In the case of reception the signal is received with receiving antenna 4' and amplified by the amplifier element 12. The divider 16 divides the signal using the duplex filter 10, 10, 10 which thereupon further transmit this to the terminal device 6.

The coupling network 2 of FIG. 8 functions analogously to that as described above. The signal wattage is however relayed in the transmission case with the aid of the separators (circulators) 10, 10 from the terminal device 6 onto the summing element 18, amplified by the amplifier element 14 and transmitted by the transmission antenna 4". In the receiving case any signal amplified by the amplifier element 12 is conveyed to the divider 16 and relayed through the separators 10, 10 to the terminal devices 6.

Figure 9:
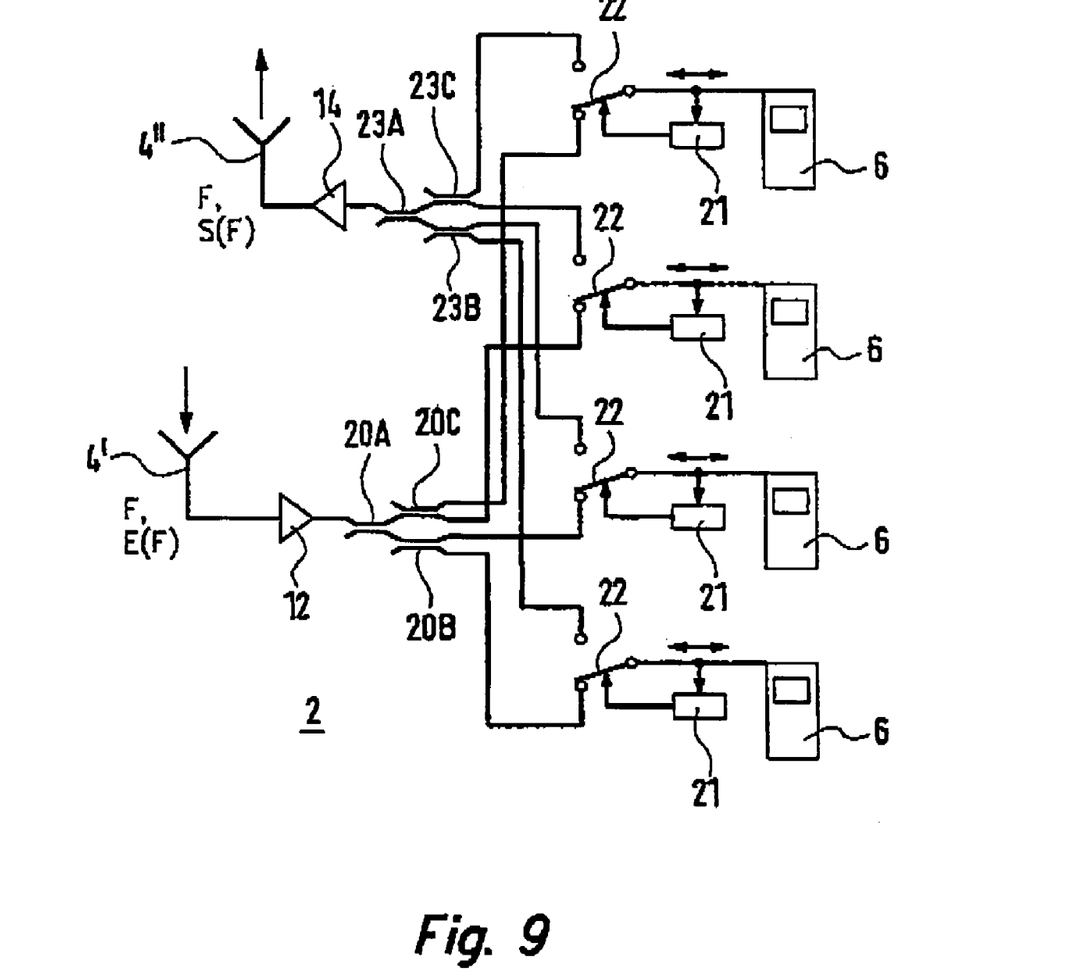

The directional separation can occur both for TDD as well as for FDD as shown in FIG. 9 also by electronic switches. In the case of receiving the signal received by the receiver antenna 4' is amplified by the amplifier element 4 and relayed via the coupler elements 20A, 20B and 20C to the terminal devices 6 via suitable switches 22. In this operating mode the switch 22 is in the position "receive". If one of the terminal devices is transmitting, then the wattage or power is recognized with the aid of an appropriate wattage detector 21, wherein the appropriate switch 22 is switched to "transmit", so that the transmission wattage is relayed via the coupler elements 23A, 23B and 23C to the amplifier elements 14 and to the transmitter antenna 4". An overriding of the transmission wattage of the transmitting terminal device 6 on the other terminal devices 4 is thereby prevented. As in the first embodiment, here also amplifier elements 12 and 14 are alternatively or additionally also provided in the terminal device branches between the couplers 20/23 and the switches 22.

By the two solution points
the operation of multiple terminal devices on a common remote antenna,
as well also the operation of multiple terminal devices on a common remote transmission antenna and a common remote receiving antenna, there is fully satisfied in both devices the common task of providing a feedback-free optimized operation with regard to the cabling requirements of multiple terminal devices which may also be bi-directional.

The invention claimed is:

1. Arrangement for operation of a plurality of terminal devices (6) on a common remote antenna (4) comprising a coupling network (2), which includes a first separator (8) associated with the antenna (4) and a second separator (10) associated with the respective terminal device (6), wherein the first separator (8) and the second separator (10) form one unit both functionally as well as spatially, and functionally are not connected with either the antenna (4) nor with one of the terminal devices (6), wherein at least one of the separators is so designed, that one single bidirectional communication path from the terminal device to the coupling network can be connected thereto, and wherein this separator separates this, bi-directional communication path into separately directed transmit and receive paths which are routed separately in the coupling network.

2. Arrangement according to claim 1, wherein at least one of the terminal devices (6) is a bi-directional operating terminal device for transmitting and receiving information.

3. Arrangement according to claim 1, wherein the coupling network (2) is provided as an alone-standing unit in the line between the antenna (4) and the terminal devices (6).

4. Arrangement according to claim 1, wherein the coupling network (2) is provided as an alone-standing unit in the antenna (4).

5. Arrangement according to claim 1, wherein the coupling network (2) is provided as an alone-standing unit associated with a apparatus independent of the arrangement.

6. Arrangement according to claim 1, wherein the coupling network (2) is integrated in one of the terminal devices (6), which includes at least one supplemental in/output (A) for one or more further terminal devices (6).

7. Arrangement according to claim 1, wherein at least one amplifier element (12, 14) is provided for compensation of losses.

8. Arrangement according to claim 7, wherein at least one amplifier element (12, 14) is provided between the first and second separator (8, 10).

9. Arrangement according to claim 7, wherein an amplifier element (12) is provided on the receiver side of the antenna (4).

10. Arrangement according to claim 1, wherein an amplifier element (12) is provided on the receiver side the antenna (4).

11. Arrangement according to claim 1, wherein one common amplifier element (14) is provided on the transmission side of all terminal devices (6).

12. Arrangement according to claim 1, wherein one associated amplifier element (14) is provided respectively on the transmit side of the terminal devices (6).

13. Arrangement according to claim 1, wherein as the separator element (8, 10) a circulator or a directional coupler is provided.

14. Arrangement according to claim 1, wherein as the separator (8, 10) a filter, in particular a duplex filter, is provided.

15. Arrangement according to claim 1, wherein a switch (22) is provided as the separator (8, 10).

16. Arrangement according to claim 1, wherein a divider (16) is provided on the receiver side for separation or distribution of the receive signals (B) to the terminal devices (6) and/or a summing element (18) is provided on the transmit side for emission of the transmission of the transmit signal (S).

17. Arrangement for operation of a plurality of terminal devices (6) on a common remote antenna (4), wherein multiple transmit signals (S) and/or multiple receive signals (E) are bundled or, as the case may be, separated from the terminal devices or, as the case may be, the terminal device (6), by means of a common coupling network (2), wherein the coupling network (2) is provided in the vicinity of or in the terminal devices (6) themselves, wherein at least one terminal device is in communication with the coupling network via a bi-directional communication pat.

18. Arrangement for operation of a plurality of terminal devices (6) on a common remote transmission antenna (4"), wherein the arrangement includes at least one separate common remote receive antenna (4') which is supplemental to the common remote transmit antenna (4"), wherein the respective terminal devices (6) are coupled with each other via a coupling network (2), comprised of the separators (10) associated with the respective terminal devices (6), wherein at least one of the separators (10) is so designed, that a single, bi-directional communication path can be connected thereto leading from the terminal device to the coupling network, and wherein the separator separates this bi-directional communication path into separately directed transmit and receive paths in the coupling network.

19. Arrangement according to claim 18, wherein the antennas (4', 4") are arranged spatially separated, so that the necessary insulation between the transmit and receive path is the free air space insulation between the antennas (4', 4").

20. Arrangement according to claim 18, wherein the antennas (4', 4") are decoupled by switches.

21. Arrangement according to claim 18, wherein at least one amplifier element (12, 14) is provided for compensation of losses.

22. Arrangement according to claim 18, wherein one amplifier element (12, 14) is respectively provided between the antennas (4', 4") and the separator (10).

23. Arrangement according to claim 18, wherein the receiving antenna (4') is associated with an amplifier element.

24. Arrangement according to claim 18, wherein on the transmit side of all terminal devices (6) a common amplifier element (14) is provide.

25. Arrangement according to claim 18, wherein on the transmit side of the terminal devices (6) respectively one associated amplifier element (14) is provided.

26. Arrangement according to claim 18, wherein a circulator or a directional coupler is provided as the separator (10).

27. Arrangement according to claim 18, wherein a filter, in particular a duplex filter, is provided as the separator (10).

28. Arrangement according to claim 18, wherein a switch (22) is provided as the separator (10).

29. Arrangement according to claim 18, wherein a divider (16) is provided on the receiver side for dividing or distributing the received signals (B) to the terminal devices (6) and/or a summing element (18) is provided on the transmit side for emission of the transmit signal (S).

30. Arrangement according to claim 18, wherein the coupling network (2) is itself provided near to or in the terminal devices (6).

31. Arrangement according to claim 18, wherein the coupling network (2) is integrated in a terminal device (6), which includes at least one supplemental in/output (A) for one or more further terminal devices.

* * * * *